(12) United States Patent
Kim et al.

(10) Patent No.: US 9,690,330 B2
(45) Date of Patent: Jun. 27, 2017

(54) MOBILE TERMINAL

(71) Applicant: LG ELECTRONICS INC., Seoul (KR)

(72) Inventors: Sungpil Kim, Seoul (KR); Kidoo Han, Seoul (KR); Bohyoung Lee, Seoul (KR); Hosung Nam, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/963,077

(22) Filed: Dec. 8, 2015

(65) Prior Publication Data

US 2016/0352878 A1 Dec. 1, 2016

(30) Foreign Application Priority Data

Jun. 1, 2015 (KR) .................... 10-2015-0077206
Sep. 3, 2015 (KR) .................... 10-2015-0124766

(51) Int. Cl.
*H04M 1/02* (2006.01)
*G06F 1/16* (2006.01)
*H04W 88/02* (2009.01)

(52) U.S. Cl.
CPC ........ *G06F 1/1652* (2013.01); *H04M 1/0202* (2013.01); *H04M 1/0268* (2013.01); *H04W 88/02* (2013.01)

(58) Field of Classification Search
CPC ......... H04M 1/02; G06F 1/1625; G11C 1/406
See application file for complete search history.

(56) References Cited

U.S. PATENT DOCUMENTS

| | | | |
|---|---|---|---|
| 2012/0264489 A1* | 10/2012 | Choi | H04M 1/0216 455/566 |
| 2014/0334224 A1* | 11/2014 | Cordero | G11C 11/406 365/149 |
| 2015/0116920 A1* | 4/2015 | Franklin | G06F 1/1626 361/679.26 |

FOREIGN PATENT DOCUMENTS

| | | | | |
|---|---|---|---|---|
| JP | 2012-134971 A | | 7/2012 | |
| KR | 1020100060645 | * | 6/2010 | ............. H04M 1/02 |
| KR | 10-2011-0025060 A | | 3/2011 | |
| KR | 10-2015-0026082 A | | 3/2015 | |
| WO | 2014-106680 A1 | | 7/2014 | |

OTHER PUBLICATIONS

PCT International Application No. PCT/KR2015/013872, International Search Report dated Mar. 31, 2016, 13 pages.

* cited by examiner

*Primary Examiner* — Myron K Wyche
(74) *Attorney, Agent, or Firm* — Lee, Hong, Degerman, Kang & Waimey

(57) ABSTRACT

A mobile terminal comprises a flexible display module; a hinge frame coupled to a rear surface of the flexible display module, having a plurality of unit frames connected by hinge coupling in a length direction; and a variable frame arranged in the hinge frame in a length direction, of which length is controllable, wherein the display module and the hinge frame are bent or unfolded to be flat in accordance with a length change of the variable frame. Since the mobile terminal may control its curved level in accordance with a use condition, it is advantageous in that a sense of immersion of the screen is increased by the control of the curvature of the mobile terminal if necessary and it is convenient to set the mobile terminal.

20 Claims, 15 Drawing Sheets

MOBILE TERMINAL

CROSS-REFERENCE TO RELATED APPLICATIONS

Pursuant to 35 U.S.C. §119(a), this application claims the benefit of earlier filing dates and right of priority to Korean Patent Application No. 10-2015-0077206 filed on Jun. 1, 2015, and 10-2015-0124766 filed on Sep. 3, 2015, the contents of which are all hereby incorporated by reference herein in their entirety.

BACKGROUND OF THE INVENTION

Field of the Invention

The present invention relates to a mobile terminal which is curved.

Discussion of the Related Art

Terminals may be generally classified as mobile/portable terminals or stationary terminals according to their mobility. Mobile terminals may also be classified as handheld terminals or vehicle mounted terminals according to whether or not a user can directly carry the terminal.

Mobile terminals have become increasingly more functional. Examples of such functions include data and voice communications, capturing images and video via a camera, recording audio, playing music files via a speaker system, and displaying images and video on a display. Some mobile terminals include additional functionality which supports game playing, while other terminals are configured as multimedia players. More recently, mobile terminals have been configured to receive broadcast and multicast signals which permit viewing of content such as videos and television programs.

As such functions become more diversified, the mobile terminal can support more complicated functions such as capturing images or video, reproducing music or video files, playing games, receiving broadcast signals, and the like. By comprehensively and collectively implementing such functions, the mobile terminal may be embodied in the form of a multimedia player or device.

The display is formed in a rectangular shape of which one side length is long, and is used in such a manner that it is arranged longitudinally in a horizontal direction when a user watches movies or plays a game. When the user watches movies by using the entire display as one screen, it is preferable that a mobile terminal is provided with a curved display for a sense of immersion.

However, if the mobile terminal has a curved display, the mobile terminal is formed with a curved surface, whereby a problem occurs in that inconvenience is caused when the user carries the mobile terminal having a curved surface.

SUMMARY OF THE INVENTION

Accordingly, the present invention is directed to a mobile terminal that substantially obviates one or more problems due to limitations and disadvantages of the related art.

An object of the present invention is to provide a mobile terminal which is curved and a method for controlling the same.

Additional advantages, objects, and features of the specification will be set forth in part in the description which follows and in part will become apparent to those having ordinary skill in the art upon examination of the following or may be learned from practice of the specification. The objectives and other advantages of the specification may be realized and attained by the structure particularly pointed out in the written description and claims hereof as well as the appended drawings.

To achieve these objects and other advantages and in accordance with the purpose of the specification, as embodied and broadly described herein, a mobile terminal according to the present invention comprises a display module including a flexible display; a hinge frame coupled to a rear side of the display module, the hinge frame having a plurality of unit frames that are each connected by at least one hinge to an adjacent unit frame among the plurality of unit frames; and a variable frame including a first portion attached to a unit frame located at one end of the hinge frame and a second portion attached to a unit frame located at the other end of the hinge frame, the variable frame having a variable length, wherein the display module and the hinge frame are positionable between a bent configuration and a flat, based on the variable length of the variable frame that is increased or decreased.

The variable frame includes an elastic tape located on the hinge frame, the elastic tape having a first end fixed to the unit frame located at one end of the hinge frame and a second end extended in a direction of the other side of the hinge frame; and a length control unit fixed to the unit frame that is located at the other end of the hinge frame, the length control unit fastened to the second end of the elastic tape, wherein a position of the elastic tape, to which the length control unit is fastened, is variable.

The elastic tape includes a plurality of hanging protrusions formed at the second end; and the length control unit includes fixed protrusions fixed to the hinge frame to adjoin between the plurality of hanging protrusions and an elastic member applying a force to the fixed protrusions in a direction of the plurality of hanging protrusions.

The elastic tape is located in a front surface of the hinge frame, and the hinge is located in a rear surface of the hinge frame.

The length control unit further includes a driver configured to control its position fastened to the elastic tape; and a controller configured to control the driver increase a length of the variable frame when the mobile terminal arranged in a horizontal direction or receive a curve command.

The plurality of unit frames include a first unit frame having an extension part protruded in a direction of a unit frame adjacent at a boundary of the unit frame; and a second unit frame coupled to the first unit frame by the hinge and having a recessed part cut to correspond to the extension part.

The extension part includes an incline formed on a rear surface of the extension part.

The extension part includes an aperture formed at a portion through which the variable frame passes.

The hinge frame includes a boss protruded from a rear surface of the display unit; a boss hole formed in the hinge frame through which the boss passes; and a screw inserted to the boss through a rear surface of the hinge frame, wherein the boss hole at a center portion in a length direction of the hinge frame has a size corresponding to a shape of the boss, and boss holes located at an upper portion and a lower portion of the hinge frame in the length direction are greater in their size than a size of the boss in a length direction.

The mobile terminal further comprises a subsidiary plate coupled on the rear surface of the display unit, wherein the boss is formed on the subsidiary plate, and coupling portion between the display unit and the subsidiary plate has an area that is narrower than a diameter of the boss in a length direction.

The mobile terminal further comprises a rear case covering a rear surface of the hinge frame, wherein the rear case is coupled to the display unit and the hinge frame, and the rear case includes an elastic material.

The rear case comprises a sidewall covering sides of the display unit and the hinge frame; a coupling clip protruded inwardly from the sidewall, having a narrow inlet between the display unit and the hinge frame and a wide inner side; and a coupling protrusion protruded on the rear side of the display unit at a position corresponding to the coupling clip.

The mobile terminal further comprises a recess part formed in the hinge frame at a position corresponding to the coupling protrusion and the coupling clip, wherein the recess part is formed along a circumference of the hinge frame, and the recess unit has an outer sidewall that is opened.

The coupling clip has a ring shape that includes an inlet opened toward an inner side of the rear case; the coupling protrusion has a cylindrical shape with a size corresponding to a size of the ring shape; and the recess unit further includes a support protrusion inserted to the opened inlet of the coupling clip at the sidewall of the recess unit.

The mobile terminal further comprises a fitting protrusion protruded in a front direction from the inner side of the rear case; and a fitting hole formed at a position corresponding to the fitting protrusion of the hinge frame.

The mobile terminal further comprises a curvature sensing device sensing a curvature radius of the variable frame, wherein the curvature sensing device includes an optical sensor having a light-emitting unit and a light-receiving unit, which are selectively covered by the elastic tape in accordance with a length change of the variable frame, and a controller calculating a curvature of the hinge frame depending on whether light emitted from the light-emitting unit is reflected in the elastic tape and received in the light-receiving unit.

The curvature sensing device includes a rotation rod having a first end coupled to the elastic tape rotatably by a first pin, rotatably coupled to the hinge frame by a second pin at a position spaced apart from the first pin as much as a first distance, and an operation sensor sensing a motion of a second end of the rotation rod.

The curvature sensing device further includes a magnetic material located at the second end of the rotation rod, wherein the operation sensor is a hole sensor sensing a magnetic change based on the position of the magnetic material, and the controller calculates a curvature of the hinge frame and a length change of the variable frame on the basis of magnetic intensity sensed by the hole sensor.

A second distance from the second pin to the second end of the rotation rod is longer than the first distance.

The curvature sensing device further includes a side tape having a first end coupled to the other side of the hinge frame, extended in a direction of one side of the hinge frame, a rotation rod having a first end rotatably coupled to the elastic tape by a first pin, rotatably coupled to the side tape by a second pin at a position spaced apart from the first pin at a first distance, and an operation sensor sensing a motion of a second end of the rotation rod.

The curvature sensing device further includes a plurality of hollow holes formed in the hinge frame to correspond to the side tape and a third pin fastened to the side tape and inserted into the hollow hole, and a position of the support pin is varied within the hollow hole in accordance with a length change of the variable frame.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings, which are given by illustration only, and thus are not limitative of the present invention, and wherein.

DETAILED DESCRIPTION OF THE PREFERRED EMBODIMENTS

Figure 1A:
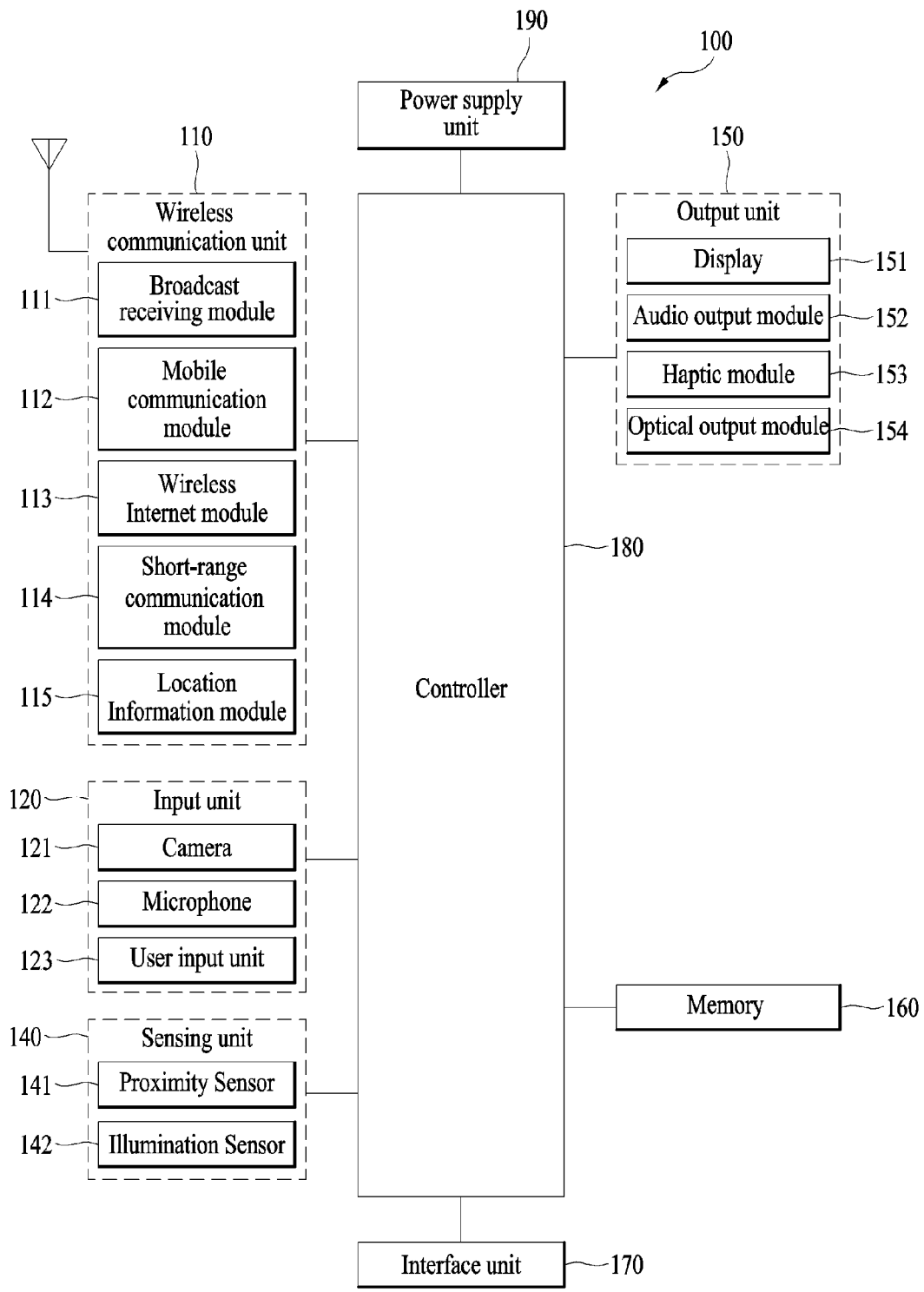
FIG. 1A is a block diagram of a mobile terminal in accordance with the present disclosure.

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context. Terms such as "include" or "has" are used herein and should be understood that they are intended to indicate an existence of several components, functions or steps, disclosed in the specification, and it is also understood that greater or fewer components, functions, or steps may likewise be utilized.

Mobile terminals presented herein may be implemented using a variety of different types of terminals. Examples of such terminals include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, and the like.

Figure 1B:
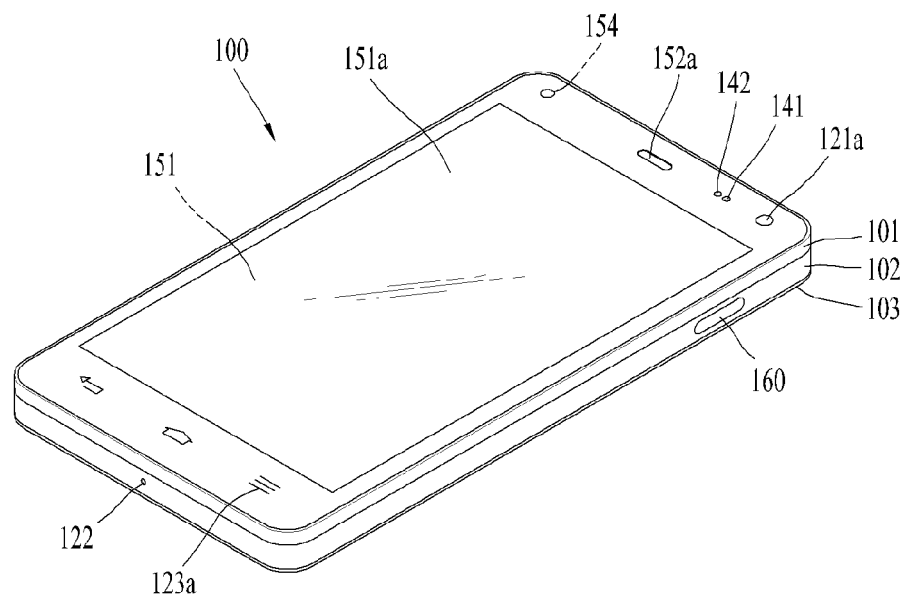
FIGS. 1B and 1C are conceptual views of one example of the mobile terminal, viewed from different directions.
Figure 1C:
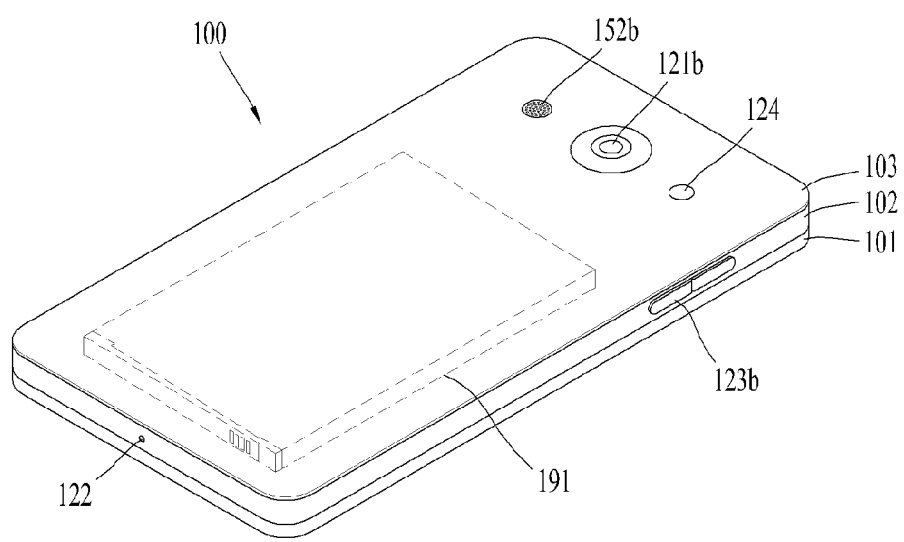

Reference is now made to FIGS. 1A-1C, where FIG. 1A is a block diagram of a mobile terminal in accordance with the present disclosure, and FIGS. 1B and 1C are conceptual views of one example of the mobile terminal, viewed from different directions.

The mobile terminal 100 is shown having components such as a wireless communication unit 110, an input unit 120, a sensing unit 140, an output unit 150, an interface unit 160, a memory 170, a controller 180, and a power supply unit 190. It is understood that implementing all of the illustrated components is not a requirement, and that greater or fewer components may alternatively be implemented.

Referring now to FIG. 1A, the mobile terminal 100 is shown having wireless communication unit 110 configured with several commonly implemented components. For instance, the wireless communication unit 110 typically includes one or more components which permit wireless communication between the mobile terminal 100 and a wireless communication system or network within which the mobile terminal is located.

The wireless communication unit 110 typically includes one or more modules which permit communications such as wireless communications between the mobile terminal 100 and a wireless communication system, communications between the mobile terminal 100 and another mobile terminal, communications between the mobile terminal 100 and an external server. Further, the wireless communication unit 110 typically includes one or more modules which connect the mobile terminal 100 to one or more networks.

To facilitate such communications, the wireless communication unit 110 includes one or more of a broadcast receiving module 111, a mobile communication module 112, a wireless Internet module 113, a short-range communication module 114, and a location information module 115.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by controller 180 according to device parameters, user commands, and combinations thereof.

The sensing unit 140 is typically implemented using one or more sensors configured to sense internal information of the mobile terminal, the surrounding environment of the mobile terminal, user information, and the like. For example, in FIG. 1A, the sensing unit 140 is shown having a proximity sensor 141 and an illumination sensor 142.

If desired, the sensing unit 140 may alternatively or additionally include other types of sensors or devices, such as a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The mobile terminal 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display panel 151, an audio output module 152, a haptic module 153, and an optical output module 154. The display panel 151 may have an inter-layered structure or an integrated structure with a touch sensor in order to facilitate a touch screen. The touch screen may provide an output interface between the mobile terminal 100 and a user, as well as function as the user input unit 123 which provides an input interface between the mobile terminal 100 and the user.

The interface unit 160 serves as an interface with various types of external devices that can be coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). It is common for application programs to be stored in the memory 170, installed in the mobile terminal 100, and executed by the controller 180 to perform an operation (or function) for the mobile terminal 100.

The controller 180 typically functions to control overall operation of the mobile terminal 100, in addition to the operations associated with the application programs.

The controller 180 may provide or process information or functions appropriate for a user by processing signals, data, information and the like, which are input or output by the various components depicted in FIG. 1A, or activating application programs stored in the memory 170. As one example, the controller 180 controls some or all of the components illustrated in FIGS. 1A-1C according to the execution of an application program that have been stored in the memory 170.

The power supply unit 190 can be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

Referring now to FIGS. 1B and 1C, the mobile terminal 100 is described with reference to a bar-type terminal body. However, the mobile terminal 100 may alternatively be implemented in any of a variety of different configurations. Examples of such configurations include watch-type, clip-type, glasses-type, or as a folder-type, flip-type, slide-type, swing-type, and swivel-type in which two and more bodies are combined with each other in a relatively movable manner, and combinations thereof. Discussion herein will often relate to a particular type of mobile terminal (for example, bar-type, watch-type, glasses-type, and the like). However, such teachings with regard to a particular type of mobile terminal will generally apply to other types of mobile terminals as well.

The mobile terminal 100 will generally include a case (for example, frame, housing, cover, and the like) forming the appearance of the terminal. In this embodiment, the case is formed using a front case 101 and a rear case 102. Various electronic components are incorporated into a space formed between the front case 101 and the rear case 102. At least one middle case may be additionally positioned between the front case 101 and the rear case 102.

The display panel 151 is shown located on the front side of the terminal body to output information. As illustrated, a window 151a of the display panel 151 may be mounted to the front case 101 to form the front surface of the terminal body together with the front case 101.

In some embodiments, electronic components may also be mounted to the rear case 102. Examples of such electronic components include a detachable battery 191, an identification module, a memory card, and the like. Rear cover 103 is shown covering the electronic components, and this cover may be detachably coupled to the rear case 102. Therefore, when the rear cover 103 is detached from the rear case 102, the electronic components mounted to the rear case 102 are externally exposed.

As illustrated, when the rear cover 103 is coupled to the rear case 102, a side surface of the rear case 102 is partially exposed. In some cases, upon the coupling, the rear case 102 may also be completely shielded by the rear cover 103. In some embodiments, the rear cover 103 may include an opening for externally exposing a camera 121b or an audio output module 152b.

The cases 101, 102, 103 may be formed by injection-molding synthetic resin or may be formed of a metal, for example, stainless steel (STS), aluminum (Al), titanium (Ti), or the like.

As an alternative to the example in which the plurality of cases form an inner space for accommodating components, the mobile terminal 100 may be configured such that one case forms the inner space. In this example, a mobile terminal 100 having a uni-body is formed in such a manner that synthetic resin or metal extends from a side surface to a rear surface.

If desired, the mobile terminal 100 may include a waterproofing unit (not shown) for preventing introduction of water into the terminal body. For example, the waterproofing unit may include a waterproofing member which is located between the window 151a and the front case 101, between the front case 101 and the rear case 102, or between the rear case 102 and the rear cover 103, to hermetically seal an inner space when those cases are coupled.

FIGS. 1B and 1C depict certain components as arranged on the mobile terminal.

It is to be understood that alternative arrangements are possible and within the teachings of the instant disclosure. Some components may be omitted or rearranged. For example, the first manipulation unit 123a may be located on another surface of the terminal body, and the second audio output module 152b may be located on the side surface of the terminal body.

The display panel 151 is generally configured to output information processed in the mobile terminal 100. For example, the display panel 151 may display execution screen information of an application program executing at the mobile terminal 100 or user interface (UI) and graphic user interface (GUI) information in response to the execution screen information.

The display panel 151 outputs information processed in the mobile terminal 100. The display panel 151 may be implemented using one or more suitable display devices. Examples of such suitable display devices include a liquid crystal display (LCD), a thin film transistor-liquid crystal display (TFT-LCD), an organic light emitting diode (OLED), a flexible display, a 3-dimensional (3D) display, an e-ink display, and combinations thereof.

The display panel 151 may be implemented using two display devices, which can implement the same or different display technology. For instance, a plurality of the display modules 151 may be arranged on one side, either spaced apart from each other, or these devices may be integrated, or these devices may be arranged on different surfaces.

The display panel 151 may also include a touch sensor which senses a touch input received at the display module. When a touch is input to the display panel 151, the touch sensor may be configured to sense this touch and the controller 180, for example, may generate a control command or other signal corresponding to the touch. The content which is input in the touching manner may be a text or numerical value, or a menu item which can be indicated or designated in various modes.

The touch sensor may be configured in a form of a film having a touch pattern, disposed between the window 151a and a display on a rear surface of the window 151a, or a metal wire which is patterned directly on the rear surface of the window 151a. Alternatively, the touch sensor may be integrally formed with the display. For example, the touch sensor may be disposed on a substrate of the display or within the display.

The display panel 151 may also form a touch screen together with the touch sensor. Here, the touch screen may serve as the user input unit 123 (see FIG. 1A). Therefore, the touch screen may replace at least some of the functions of the first manipulation unit 123a.

The first audio output module 152a may be implemented in the form of a speaker to output voice audio, alarm sounds, multimedia audio reproduction, and the like.

The window 151a of the display panel 151 will typically include an aperture to permit audio generated by the first audio output module 152a to pass. One alternative is to allow audio to be released along an assembly gap between the structural bodies (for example, a gap between the window 151a and the front case 101). In this case, a hole independently formed to output audio sounds may not be seen or is otherwise hidden in terms of appearance, thereby further simplifying the appearance and manufacturing of the mobile terminal 100.

The optical output module 154 can be configured to output light for indicating an event generation. Examples of such events include a message reception, a call signal reception, a missed call, an alarm, a schedule notice, an email reception, information reception through an application, and the like. When a user has checked a generated event, the controller can control the optical output unit 154 to stop the light output.

The first camera 121a can process image frames such as still or moving images obtained by the image sensor in a capture mode or a video call mode. The processed image frames can then be displayed on the display panel 151 or stored in the memory 170.

The first and second manipulation units 123a and 123b are examples of the user input unit 123, which may be manipulated by a user to provide input to the mobile terminal 100. The first and second manipulation units 123a and 123b may also be commonly referred to as a manipulating portion, and may employ any tactile method that allows the user to perform manipulation such as touch, push, scroll, or the like. The first and second manipulation units 123a and 123b may also employ any non-tactile method that allows the user to perform manipulation such as proximity touch, hovering, or the like.

FIG. 1B illustrates the first manipulation unit 123a as a touch key, but possible alternatives include a mechanical key, a push key, a touch key, and combinations thereof.

Input received at the first and second manipulation units 123a and 123b may be used in various ways. For example, the first manipulation unit 123a may be used by the user to provide an input to a menu, home key, cancel, search, or the like, and the second manipulation unit 123b may be used by the user to provide an input to control a volume level being output from the first or second audio output modules 152a or 152b, to switch to a touch recognition mode of the display panel 151, or the like.

As another example of the user input unit 123, a rear input unit (not shown) may be located on the rear surface of the terminal body. The rear input unit can be manipulated by a user to provide input to the mobile terminal 100. The input may be used in a variety of different ways. For example, the rear input unit may be used by the user to provide an input for power on/off, start, end, scroll, control volume level being output from the first or second audio output modules 152a or 152b, switch to a touch recognition mode of the display panel 151, and the like. The rear input unit may be configured to permit touch input, a push input, or combinations thereof.

The rear input unit may be located to overlap the display panel 151 of the front side in a thickness direction of the terminal body. As one example, the rear input unit may be located on an upper end portion of the rear side of the terminal body such that a user can easily manipulate it using a forefinger when the user grabs the terminal body with one hand. Alternatively, the rear input unit can be positioned at most any location of the rear side of the terminal body.

Embodiments that include the rear input unit may implement some or all of the functionality of the first manipulation unit 123a in the rear input unit. As such, in situations where the first manipulation unit 123a is omitted from the front side, the display panel 151 can have a larger screen.

As a further alternative, the mobile terminal 100 may include a finger scan sensor which scans a user's fingerprint. The controller 180 can then use fingerprint information sensed by the finger scan sensor as part of an authentication procedure. The finger scan sensor may also be installed in the display panel 151 or implemented in the user input unit 123.

The microphone 122 is shown located at an end of the mobile terminal 100, but other locations are possible. If desired, multiple microphones may be implemented, with such an arrangement permitting the receiving of stereo sounds.

The interface unit 160 may serve as a path allowing the mobile terminal 100 to interface with external devices. For example, the interface unit 160 may include one or more of a connection terminal for connecting to another device (for example, an earphone, an external speaker, or the like), a port for near field communication (for example, an Infrared Data Association (IrDA) port, a Bluetooth port, a wireless LAN port, and the like), or a power supply terminal for supplying power to the mobile terminal 100. The interface unit 160 may be implemented in the form of a socket for accommodating an external card, such as Subscriber Identification Module (SIM), User Identity Module (UIM), or a memory card for information storage.

The second camera 121b is shown located at the rear side of the terminal body and includes an image capturing direction that is substantially opposite to the image capturing direction of the first camera unit 121a. If desired, second camera 121a may alternatively be located at other locations, or made to be moveable, in order to have a different image capturing direction from that which is shown.

The second camera 121b can include a plurality of lenses arranged along at least one line. The plurality of lenses may also be arranged in a matrix configuration. The cameras may be referred to as an "array camera." When the second camera 121b is implemented as an array camera, images may be captured in various manners using the plurality of lenses and images with better qualities.

As shown in FIG. 1C, a flash 124 is shown adjacent to the second camera 121b. When an image of a subject is captured with the camera 121b, the flash 124 may illuminate the subject.

As shown in FIG. 1B, the second audio output module 152b can be located on the terminal body. The second audio output module 152b may implement stereophonic sound functions in conjunction with the first audio output module 152a, and may be also used for implementing a speaker phone mode for call communication.

At least one antenna for wireless communication may be located on the terminal body. The antenna may be installed in the terminal body or formed by the case. For example, an antenna which configures a part of the broadcast receiving module 111 may be retractable into the terminal body. Alternatively, an antenna may be formed using a film attached to an inner surface of the rear cover 103, or a case that includes a conductive material.

A power supply unit 190 for supplying power to the mobile terminal 100 may include a battery 191, which is mounted in the terminal body or detachably coupled to an outside of the terminal body.

The battery 191 may receive power via a power source cable connected to the interface unit 160. Also, the battery 191 can be recharged in a wireless manner using a wireless charger. Wireless charging may be implemented by magnetic induction or electromagnetic resonance.

The rear cover 103 is shown coupled to the rear case 102 for shielding the battery 191, to prevent separation of the battery 191, and to protect the battery 191 from an external impact or from foreign material. When the battery 191 is detachable from the terminal body, the rear case 103 may be detachably coupled to the rear case 102.

An accessory for protecting an appearance or assisting or extending the functions of the mobile terminal 100 can also be provided on the mobile terminal 100. As one example of an accessory, a cover or pouch for covering or accommodating at least one surface of the mobile terminal 100 may be provided. The cover or pouch may cooperate with the display panel 151 to extend the function of the mobile terminal 100. Another example of the accessory is a touch pen for assisting or extending a touch input to a touch screen.

Figure 2:
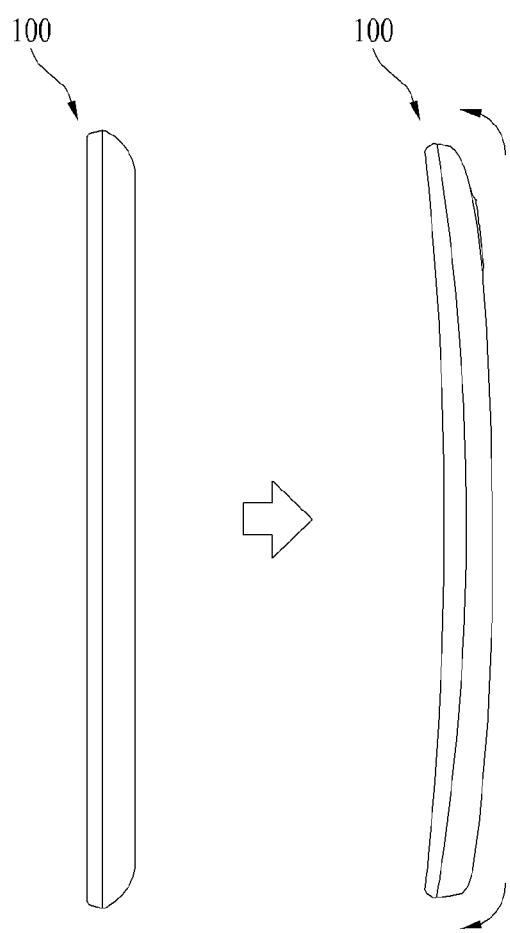
FIG. 2 is a side view of a mobile terminal according to the present invention.

FIG. 2 is a side view of a mobile terminal 100 according to the present invention. The mobile terminal 100 of the present invention is characterized in that the mobile terminal 100 is curved in one direction. In this embodiment, the mobile terminal 100 is curved while forming a curved surface in a length direction (vertical direction). However, the mobile terminal 100 may be curved while forming a curved surface in a width direction (horizontal direction) without being limited to the embodiment of the present invention.

The mobile terminal 100 of the present invention may vary a curvature gradually, and may maintain a curved state if a force, which deforms a shape artificially in the curved state, is not applied thereto.

If the curvature is varied, since a mouse and an ear of a user are not located on a straight line when the user makes a call while carrying the mobile terminal in a bar shape, a clearer voice may be transferred to the other party more than a case where the mobile terminal is curved.

Also, when the user watches moving pictures or plays games by turning the mobile terminal 100 to a horizontal direction, if the display panel 151 is in the curved state, it is advantageous in that a sense of immersion is excellent. Also, in a state that the mobile terminal 100 is curved, the mobile terminal 100 may be set in such a manner that it is erected in a direction to allow its side to be in contact with the bottom. For such a curved structure, a flexible material may be used, or a hinge 1055 may be used to implement a curved structure.

Figure 3:
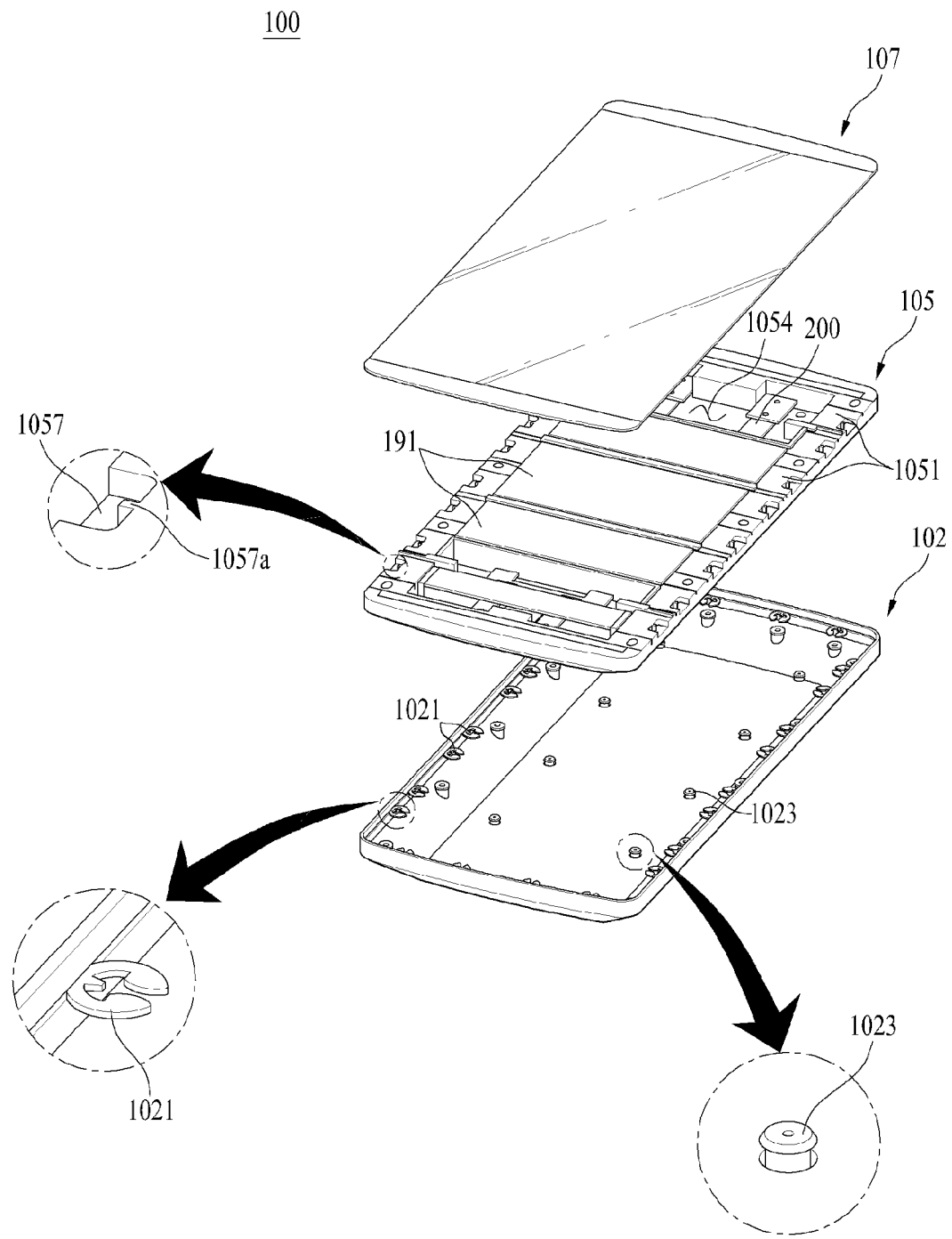
FIG. 3 is a front exploded perspective view of a mobile terminal according to the present invention.

FIG. 3 is a front exploded perspective view of a mobile terminal 100 according to the present invention. The mobile terminal 100 includes a display module 107, a hinge frame 105, and a rear case 102.

The display module 107 includes a flexible display that may be deformed by an external force. The deformation may be at least one of curve, bending, folding, twisting, and winding of the display module 107. The flexible display means a robust display which is lightweight and is not fragile as it is manufactured on a thin and flexible substrate that enables curve, bending, folding, twisting or winding such as a paper while maintaining properties of the conventional flat display.

In a state (for example, an infinite curvature radius state, hereinafter, referred to as first state) that the flexible display panel 151 is not deformed, a display area of the flexible display panel 151 becomes a flat surface. In the first state, the display area may be a curved surface in a state (for example, a finite curvature radius state, hereinafter, referred to as second state) that the first state is deformed by an external force. As shown, information displayed in the second state may be visual information output on the curved surface. This visual information is implemented as luminescence of unit pixels (sub-pixel) arranged in a matrix arrangement is controlled autonomously. The unit pixel means a minimum unit for implementing one color.

The flexible display panel 151 may be arranged in a curved state (for example, state curved in up and down direction or left and right direction) not a flat state in the first state. In this case, if an external force is applied to the flexible display panel 151, the flexible display panel 151 may be deformed into a flat state (or less curved state) or more curved state.

Meanwhile, the flexible display panel 151 may be combined with a touch sensor to implement a flexible touch screen. If a touch is performed for the flexible touch screen, the controller 180 (see FIG. 1A) may perform a control corresponding to such a touch input. The flexible touch screen may be configured to sense the touch input even in the second state as well as the first state.

Meanwhile, the mobile terminal 100 according to this modified example may be provided with a deformation sensing means that may sense deformation of the flexible display panel 151. This deformation sensing means may be included in the sensing unit 140 (see FIG. 1A).

The deformation sensing means may be provided in the flexible display panel 151 or the case 101 to sense information related to deformation of the flexible display panel 151. In this case, the information related to deformation may include a direction that the flexible display panel 151 is deformed, a deformed level, a deformed position, a deformed time, and acceleration for recovering the deformed flexible display panel 151. In addition, the information related to deformation may include various kinds of information that may be sensed by a curve of the flexible display panel 151.

Also, the controller 180 may vary information displayed on the flexible display panel 151 or generate a control signal for controlling functions of the mobile terminal 100 on the basis of the information related to deformation of the flexible display panel 151, which is sensed by the deformation sensing means.

Meanwhile, the mobile terminal 100 according to this modified example may include the case 101 for receiving the flexible display panel 151. The case 101 may be configured to be deformed together with the flexible display panel 151 by an external force considering properties of the flexible display panel 151.

The state deformation of the flexible display panel 151 is not limited to the external force. For example, when the flexible display panel 151 has the first state, the first state may be deformed into the second state by a user or command of application.

The hinge frame 105 located on the rear surface of the display module 107 is arranged in a direction that a plurality of unit frames 1051 are curved, and each unit frame is connected with another unit frame by the hinge 1055 coupling. The hinge 1055 coupling may vary an angle between the respective unit frames 1051 through rotational motion.

Each unit frame 1051 includes a front unit 1054 formed to recessed in a front direction, wherein various kinds of electronic parts such as a battery, a printed circuit board, a camera, and a speaker may be packaged in the front unit 1054. Particularly, the part, which occupies a large area, such as the battery, may be divided and respectively arranged in the front unit 1054 of each unit frame 1051. Coupling structures 1072, 1052 and 109 coupled to the display module 107 may be included at both sides of the hinge frame 105.

Figure 4:
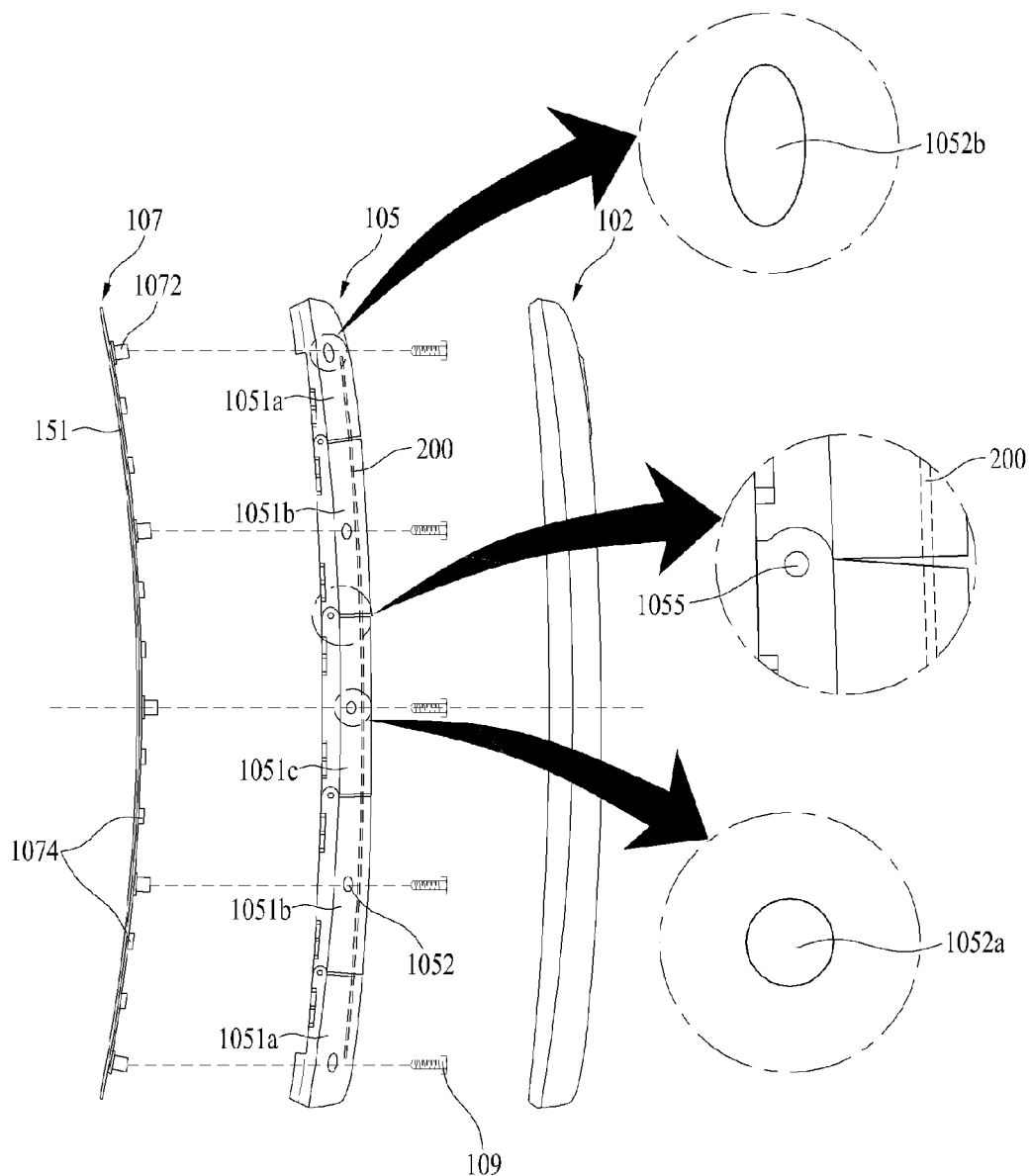
FIG. 4 is a side exploded view of a mobile terminal according to the present invention.
Figure 5:
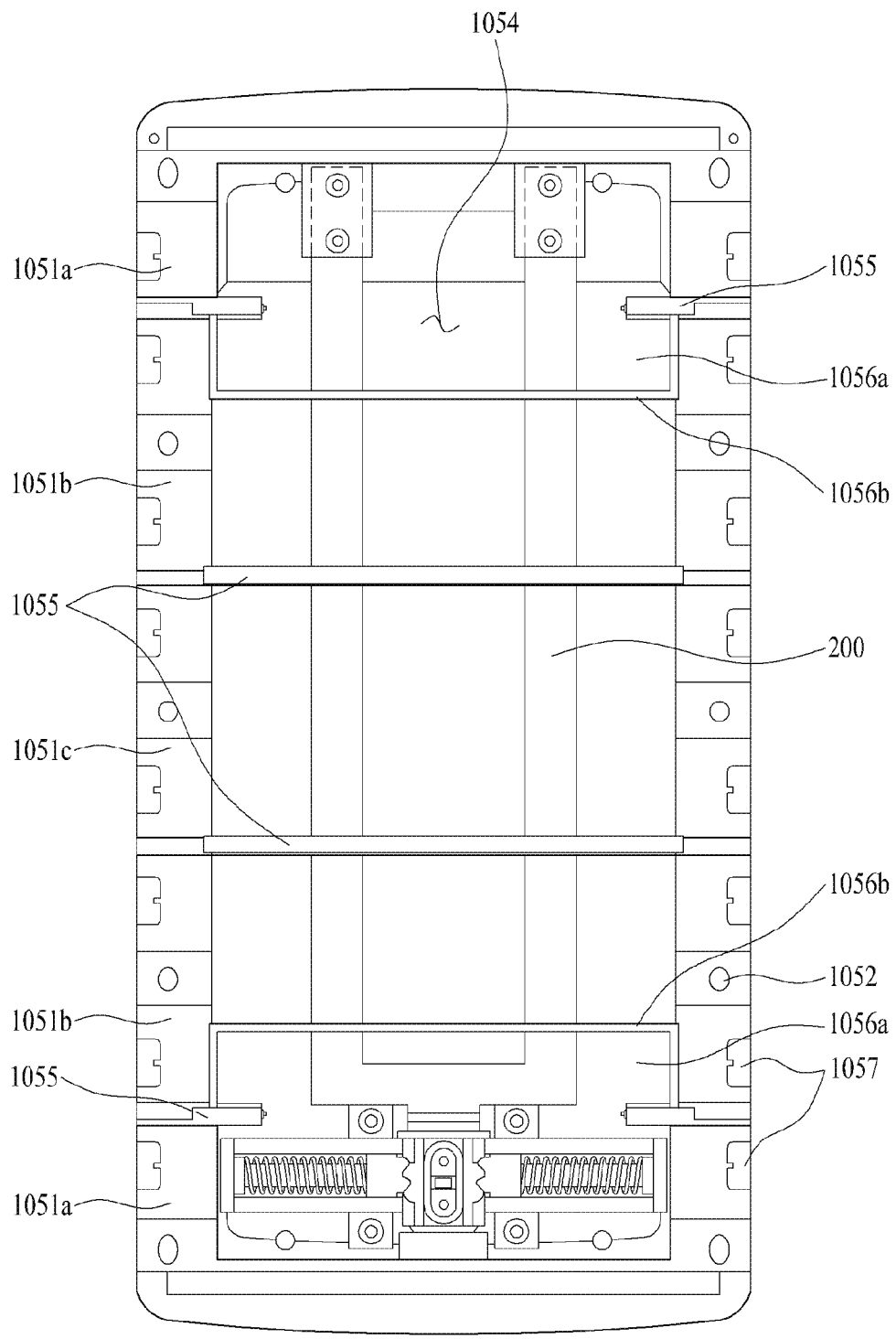
FIG. 5 is a plane view illustrating a variable frame and hinge frame of a mobile terminal according to the present invention.

FIG. 4 is a side exploded view of a mobile terminal 100 according to the present invention, and FIG. 5 is a plane view illustrating a variable frame 200 and a hinge frame 105 of the mobile terminal 100 according to the present invention. The hinge frame 105 is provided with a plurality of unit frames 1051 arranged in a length direction and a variable frame 200 arranged to pass through each unit frame 1051. The variable frame 200 may be arranged at a center portion of the hinge frame 105 as shown in FIG. 5, and has one end and the other end, which are fixed, and has a variable length.

Referring to an enlarged portion between the unit frames 1051 of FIG. 4, the variable frame 200 is located in a rear direction of the unit frame 1051, and the hinge 1055 is located in a front direction of the unit frame 1051.

If the length of the variable frame 200 is increased, an interval between the unit frames 1051 in a rear direction is increased, whereas an interval between the unit frames 1051 is increased in a front direction of the hinge frame 105 connected with the unit frame by the hinge 1055. Therefore, as shown in FIG. 4, the hinge frame 105 is curved in a front direction (a center portion of the hinge frame 105 is protruded toward a rear surface, and both ends thereof are protruded toward a front direction).

On the other hand, to provide the mobile terminal 100 which is curved in a rear direction, the unit frames 1051 may be coupled to each other by the hinge 1055 in a rear direction, and the variable frame 200 may be arranged in a front direction.

Figure 6:
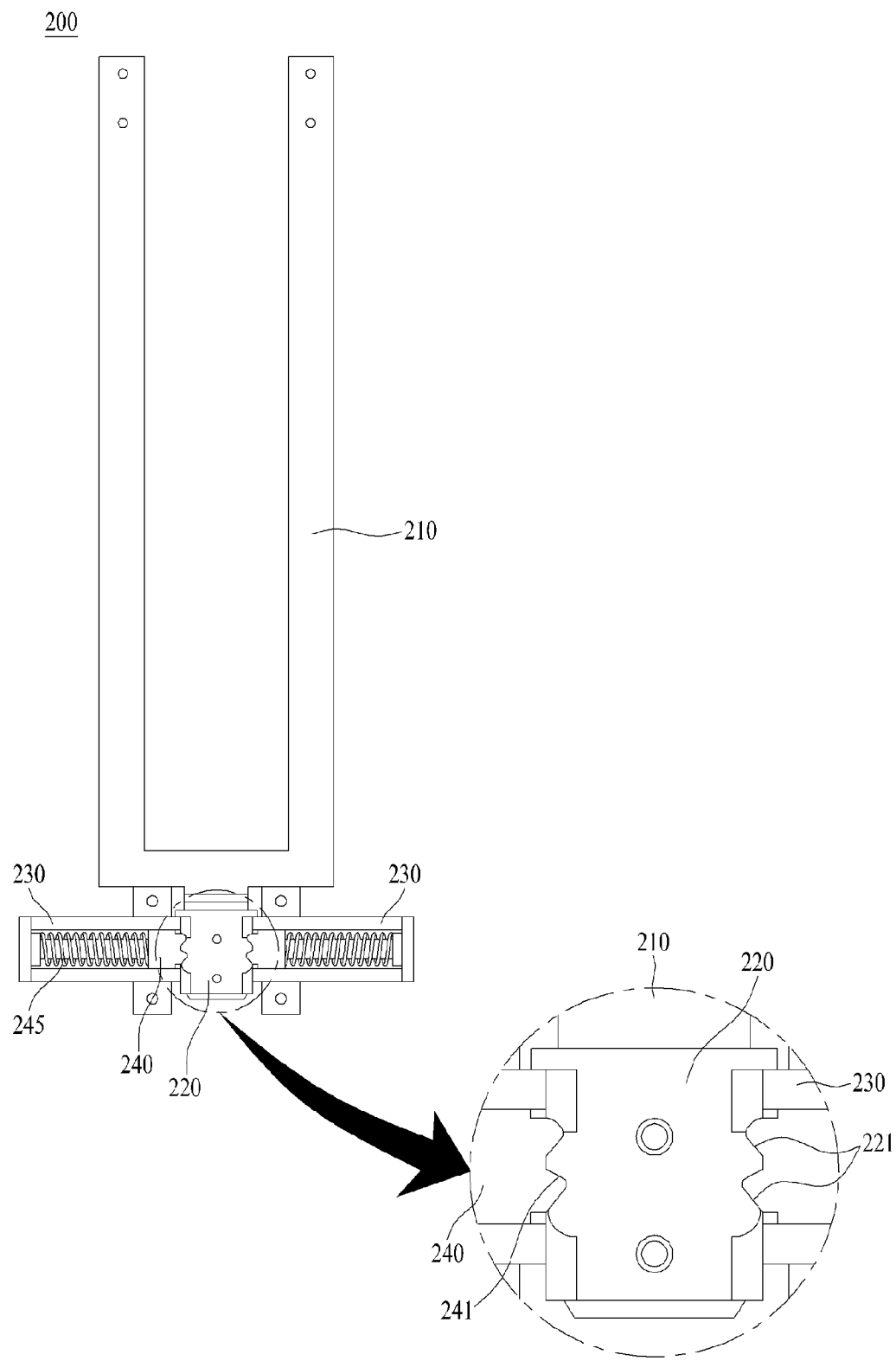
FIG. 6 is a plane view illustrating a variable frame of the mobile terminal according to the present invention.

FIG. 6 is a plane view illustrating a variable frame 200 of the mobile terminal 100 according to the present invention. An elastic tape 210 such a metal tape which may be curved is used as the variable frame 200, and one end of the elastic tape 210 is fixed to the hinge frame 105. A hanging protrusion 220, which includes a plurality of uneven portions, is arranged at the other end of the elastic tape 210, and a fixed protrusion 240, which includes uneven portions engaged with the uneven portions of the hanging protrusion 220, is arranged at both sides of the hanging protrusion 220.

The elastic tape 210 is extended along a length direction (up and down direction) of the mobile terminal 100, and the hanging protrusion 220 is protruded along a width direction (left and right direction). The fixed protrusion 240 is arranged to face the hanging protrusion 220, and an elastic member 245, which applies a force pushing the fixed protrusion 240 in a direction of the hanging protrusion 220, is arranged in a width direction of the mobile terminal 100. The hanging protrusion 220 may be formed at one side of the variable frame 200, or may be formed at both sides of the variable frame 200 as shown in FIG. 6. In this case, the elastic member 245 applies a force to the fixed protrusion 240 at both sides of the fixed protrusion 240.

The fixed protrusion 240 and the hanging protrusion 220 include inclined surfaces 221 and 241 as shown in FIG. 6. If a force is applied to the elastic tape 210 in a length direction, a direction of the force is switched to a width direction through inclined surfaces 1058 of the hanging protrusion 220 and the fixed protrusion 240, whereby the force is applied in a direction opposite to elasticity of the elastic member 245.

If the elastic tape 210 is moved in an upward direction, a full length of the variable frame 200 is increased, and the hinge frame 105 is curved in a front direction. By contrast, if the elastic tape 210 is moved in a downward direction, the full length of the variable frame 200 is reduced and the hinge frame 105 is unfolded in a flat state.

If a user manually curves the mobile terminal 100, the variable frame 200 is stretched, and the fixed protrusion 240 is fitted into the hanging protrusion 220 and maintains a curved state such that the fixed protrusion 240 is maintained in a stretched state. Alternatively, if the mobile terminal 100 includes a driving unit, which moves the hanging protrusion 220 in a length direction, the user may manipulate the driving unit to control the curvature of the mobile terminal 100. A curved level of the mobile terminal 100 is determined in accordance with the number of fixed protrusions 240 and hanging protrusions 220.

The controller 180 may vary the curvature of the mobile terminal 100 by controlling the driving unit. If the user inputs a control command to curve the mobile terminal 100, or if the user drives the driving unit to correspond to the input control command or watches a moving picture or plays a game by turning the mobile terminal 100 in a horizontal direction, a position sensor may sense a posture change of the mobile terminal 100 and then the controller may control the driving unit to curve the mobile terminal 100.

Referring to FIG. 5, in the unit frames 1051 of the hinge frame 105, the unit frame 1051c located at the center portion has a rectangular shape. However, the first unit frame 1051a includes an extension part 1056a protruded toward the second unit frame 1051b adjacent thereto, and the second unit frame 1051b includes a recessed unit 1056b corresponding to the protruded portion.

Since the first unit frame 1051a, which includes the extension part 1056a as above, may include a large scaled front unit 1054, if the electronic parts packaged in the front unit 1054 have large sizes, a space for packaging the electronic parts may be obtained. In this embodiment, a printed circuit board may be mounted on the front unit 1054 of the unit frame 1051a located on an upper portion and a lower portion.

However, the protruded portion of the first unit frame 1051a, which includes the extension part 1056a as described above, is protruded toward a rear surface of the second unit frame 1051b if the hinge 1055 is folded and then the hinge frame 105 is curved. If the protrusion is formed on the rear surface of the hinge frame 105, the protrusion collides with the rear case 102 located on the rear surface of the hinge frame 105, whereby a problem occurs in that turning of the hinge 1055 is restricted.

In order to solve the problem, the protruded portion of the first unit frame 1051a may form the inclined surface 1058.

Figure 7:
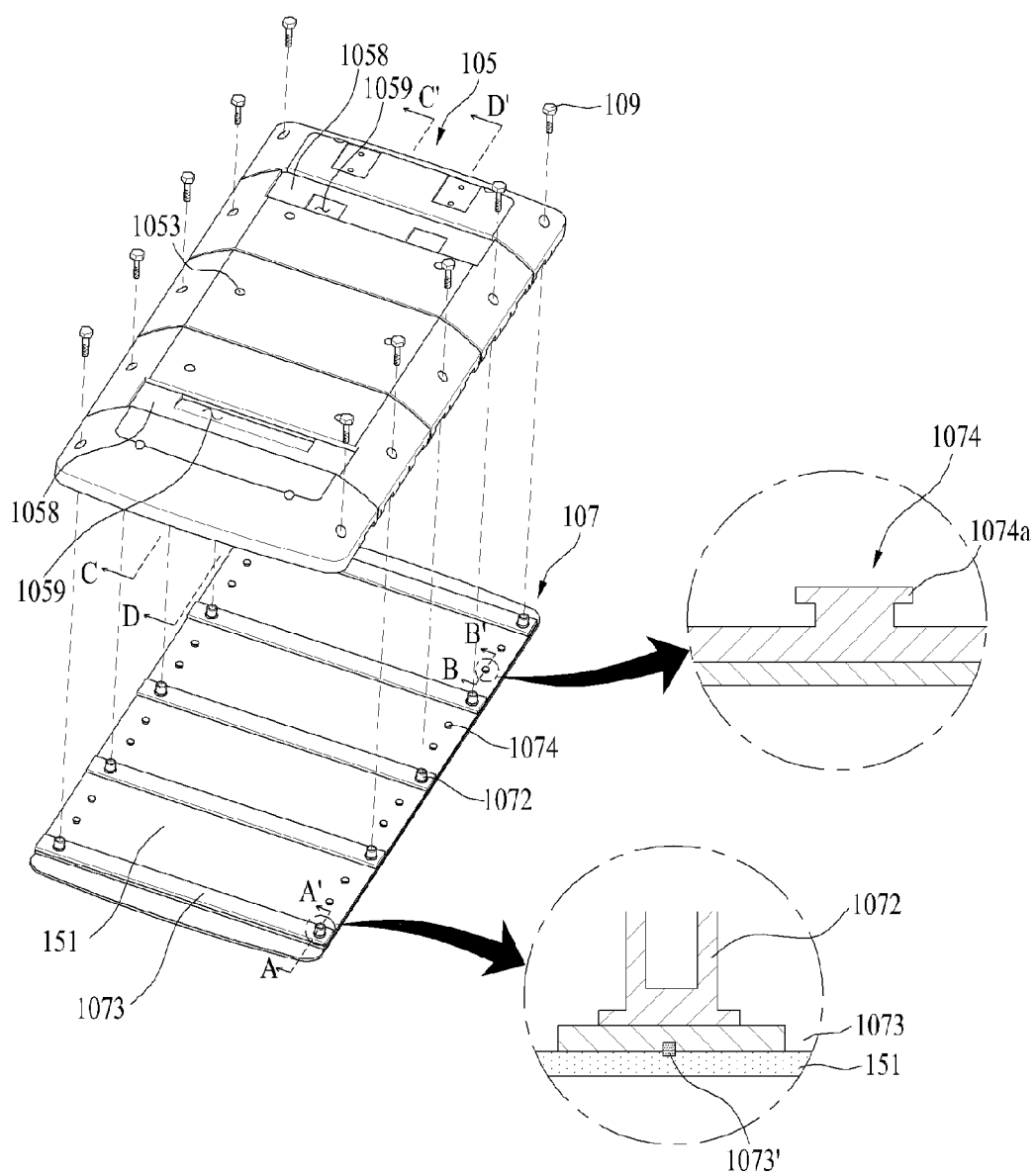
FIG. 7 is a rear exploded perspective view illustrating a display module and a hinge frame of a mobile terminal according to the present invention.
Figure 8A:
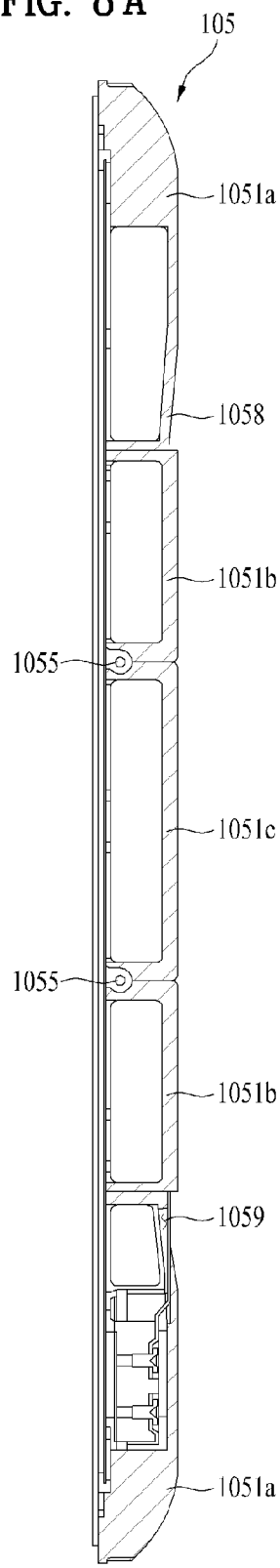
FIGS. 8A and 8B are cross-sectional views taken along line C-C' and D-D' of FIG. 7.
Figure 8B:
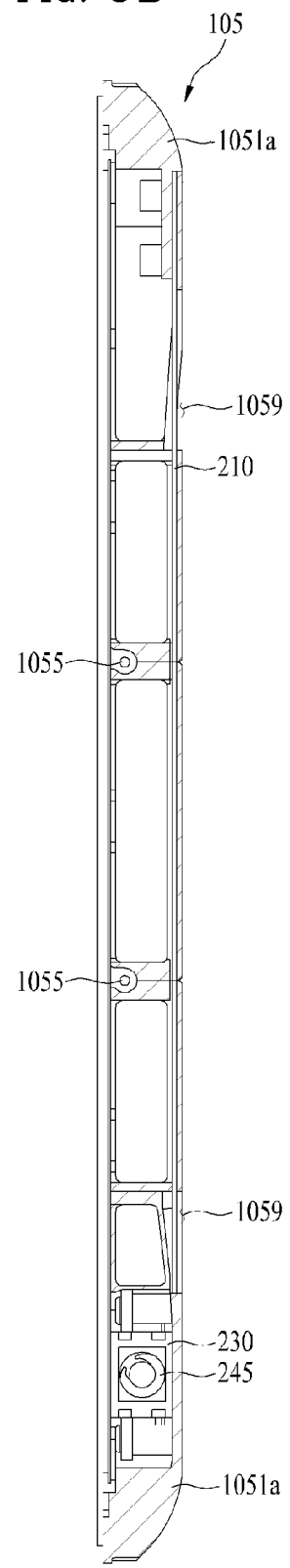

FIG. 7 is a rear exploded perspective view illustrating the display panel 151 and the hinge frame 105 of the mobile terminal 100 according to the present invention, and FIGS. 8A and 8B are cross-sectional views taken along a length direction of the hinge frame 105 of FIG. 7. FIG. 8A is a cross-sectional view taken along line C-C' of FIG. 7, and FIG. 8B is a cross-sectional view taken along line D-D' of FIG. 7.

Referring to FIG. 7, the inclined surface 1058 is formed on the rear surface of the extension part 1056a of the first unit frame 1051a, and the inclined surface 1058 is provided as shown in FIG. 8A. Even though the first unit frame 1051a is rotated based on the hinge 1055, the extension part 1056a is not protruded toward the rear surface of the second unit frame 1051b.

Since the inclined surface 1058 is inclined toward the front direction from the rear surface if the inclined surface 1058 is toward the end of the extension part 1056a, the inclined surface 1058 is protruded toward the front direction as shown in FIG. 8A. Since the variable frame 200 is located in a rear direction of the hinge frame 105, the inclined surface 1058 of the portion through which the variable frame 200 passes may be omitted to form an aperture 1059 in the extension part 1056a as shown in FIG. 8B.

Coupling of the display module 107 and the hinge frame 105 may be made through a screw 109. The screw 109 is inserted into a boss 1072 provided on the rear surface of the display module 107 in a front direction from the rear surface of the mobile terminal 100 as shown in FIGS. 4 and 7, whereby the hinge frame 105 is coupled to the display module 107.

The boss 1072 requires a sectional area of a predetermined size or more such that the screw 109 may be inserted thereinto. If the sectional area of the boss 1072 is coupled to the rear surface of the display panel 151, a problem occurs in that the portion of the display panel 151, to which the boss 1072 is coupled, is folded when the display panel 151 is curved. In order to solve the problem, a subsidiary plate 1073 is used. Referring to the cross-sectional view in a length direction of the boss 1072 of FIG. 7, a portion 1073' of the subsidiary plate 1073, which is coupled to the rear surface of the display panel 151, is narrower than the width of the boss 1072, and the boss 1072 is stably coupled to the subsidiary plate 1073.

Since a joint surface of the subsidiary plate 1073 and the display panel 151 is coupled to a narrow area only in a sectional direction of the length direction, when the flexible display panel 151 is curved, a specific portion may be curved with a slow curved surface without being folded.

Boss holes 1052 of the hinge frame 105 to which the boss 1072 is inserted include boss holes 1052 located at an upper portion and a lower portion and a boss hole 1052 located at the center as shown in FIG. 4. In this case, a size of each of the boss holes 1052 located at the upper portion and the lower portion is different from that of the boss hole 1052 located at the center. When the display module 107 and the hinge frame 105 are curved, a contact position of the upper portion and the lower portion is varied. That is, when the display module 107 and the hinge frame 105 are curved, the upper portion and the lower portion of the display module 107 are pushed more outwardly than the hinge frame 105.

In order to receive the pushed portions, the size of the boss hole 1052a at the center is the same as the size of the boss 1072. However, the boss holes 1052b of the upper portion and the lower portion may be formed in an oval shape which is long in a length direction.

Also, the position of the boss hole 1052 may be located at the center portion in a length direction of each unit frame 1051. If the display panel 151 is located at the end of the unit frame 1051, a problem occurs in that the display panel 151 is pulled toward the rear surface when the hinge 1055 portion is folded. In order to solve the problem, the boss hole 1052 is formed to be located at the center portion of the unit frame 1051 as shown in FIG. 4, and ends of the unit frames 1051 of the upper end and the lower end are not subjected to hinge coupling, whereby the boss hole 1052 may be arranged to be inclined toward the upper end or the lower end of the unit frame 1051.

The rear case coupled to the rear surface of the hinge frame 105 is made of a flexible material, and covers the rear surface of the hinge frame 105 so as not to externally expose the folded structure of the hinge frame 105.

Also, since the hinge frame 150 has a folded structure, and the display module 107 has a curved structure with a predetermined curvature, a problem occurs in that the folded hinge 1055 coupling portion of the hinge frame 105 is detached from the display module 107 and a side is spaced. In order that the spaced side is covered by the rear case 102, the rear case 102 covers the side of the hinge frame 105, and is directly coupled to the display module 107. For a coupling structure of the display module 107 and the rear case 102, a coupling clip 1021 and a coupling protrusion 1074 may be provided.

The coupling clip 1021 is protruded toward an inner side direction from the side of the rear case 102, and if the coupling protrusion 1074 is inserted through an inlet of the coupling clip 1021 as shown in FIG. 3 as the inlet is narrower than the inner side, the coupling protrusion 1074 is fixed so as not to be detached from the coupling clip 1021.

The coupling protrusion 1074 is protruded in a rear direction of the display module 107, and its end circumference 1074a is formed more greatly as shown in FIG. 7, whereby a motion in a thickness direction of the mobile terminal 100 may be fixed from the coupling clip 1021.

Figure 9A:
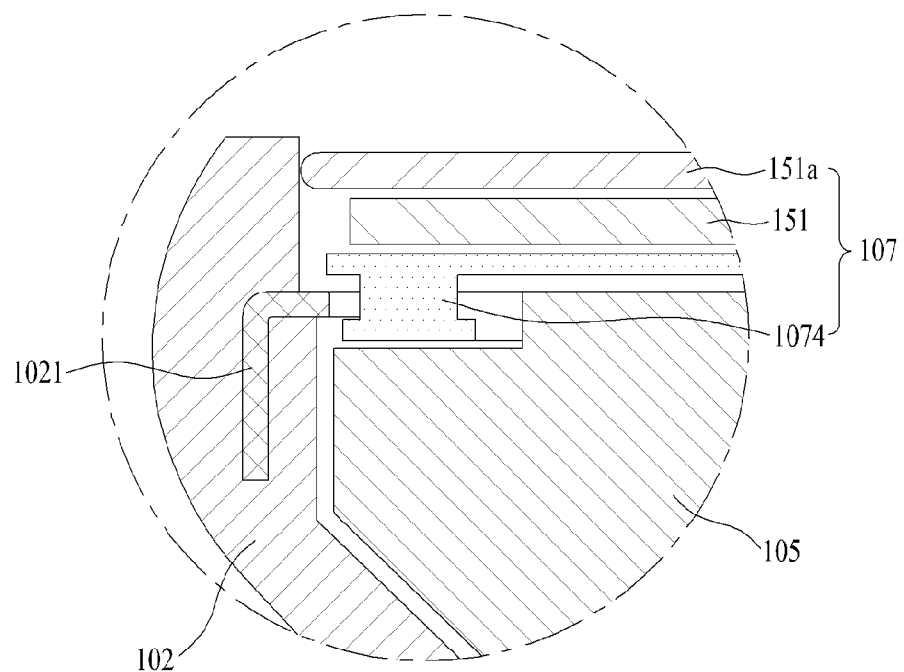
FIGS. 9A and 9B area cross-sectional view and a plane view of a coupling unit illustrating a coupling between a display unit and a rear case of a mobile terminal according to the present invention.
Figure 9B:
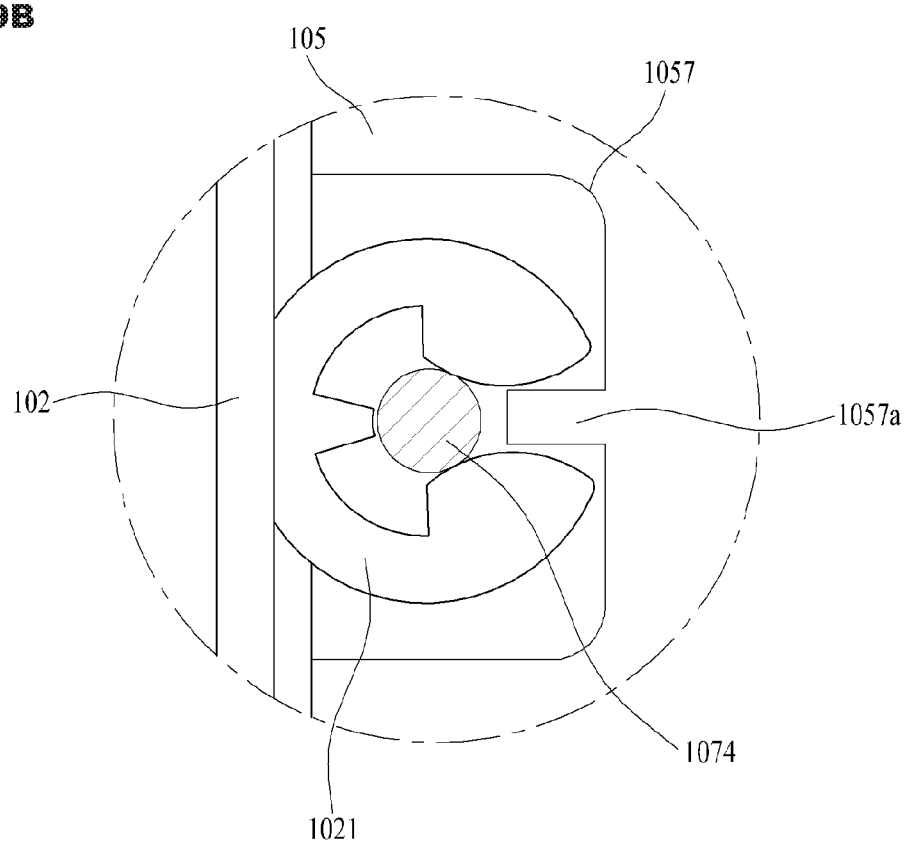

FIGS. 9A and 9B are a cross-sectional view and a plan view illustrating the coupling protrusion 1074 of the display module 107 and the coupling clip 1021 of the rear case 102 in the mobile terminal according to the present invention. As shown in FIGS. 9A and 9B, the coupling clip 1021 is inserted between the display module 107 and the hinge frame 105 and then fastened to the coupling protrusion 1074. For the space for the coupling protrusion 1074 and the coupling clip 1021, a recess unit 1057 may be further provided at the end of the hinge frame 105.

The recess unit 1057 is formed with an area corresponding to the size of the coupling clip 1021, whereby the coupling clip 1021 may minimize a motion in a vertical direction or horizontal direction of the mobile terminal 100. Also, the recess unit 1057 may further include a support protrusion 1057a inserted into the inlet portion of the coupling clip 1021. The support protrusion 1057a may fix the coupling protrusion 1074 so as not to detach the coupling protrusion 1074 from the coupling clip 1021, and may prevent the coupling clip 1021 from moving in a vertical direction.

The rear case 102 may be coupled to the display module 107 and may also be fastened with the hinge frame 105. The rear case 102 may be fastened with the hinge frame 105 by using a fitting hole 1053 formed in a rear direction of the hinge frame 105 and a fitting protrusion 1023 protruded in a front direction of the rear case 102. As shown in FIG. 3, the fitting protrusion 1023 is easy to be inserted into the fitting hole 1053 as an inclined surface is formed at the end of the fitting protrusion 1023, and its section is greater than the fitting hole 1053, whereby the fitting protrusion 1023 is fixed to the fitting hole 1053 by tight fit. If the fitting protrusion 1023 is made of an elastic material in the same manner as the rear case 102, tight fit is easy for the fitting protrusion 1023.

The mobile terminal 100 may further include a curvature sensing device to sense whether the mobile terminal 100 is in an unfolded state or curved state. A general curvature sensing device is a device for measuring a curvature of a curved surface and its size is great, whereby the general curvature sensing device cannot be applied to the mobile terminal 100. Instead, the curvature sensing device may measure a curvature change of the mobile terminal 100 by measuring a length change of the variable frame 200.

Figure 10A:
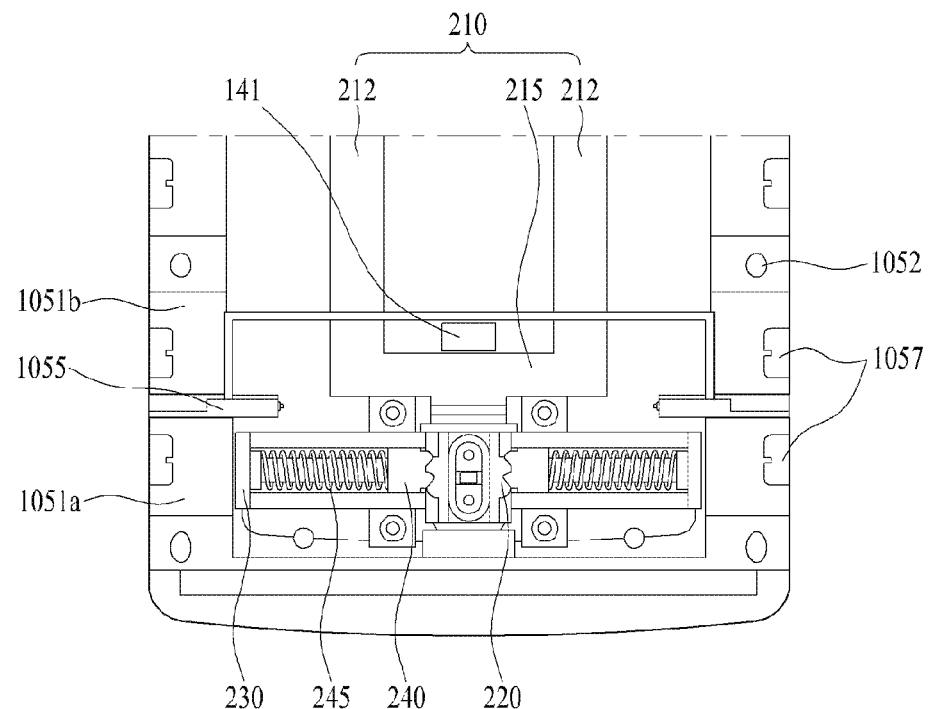
FIGS. 10A and 10B are views illustrating a motion of a variable frame 200 according to the present invention.
Figure 10B:
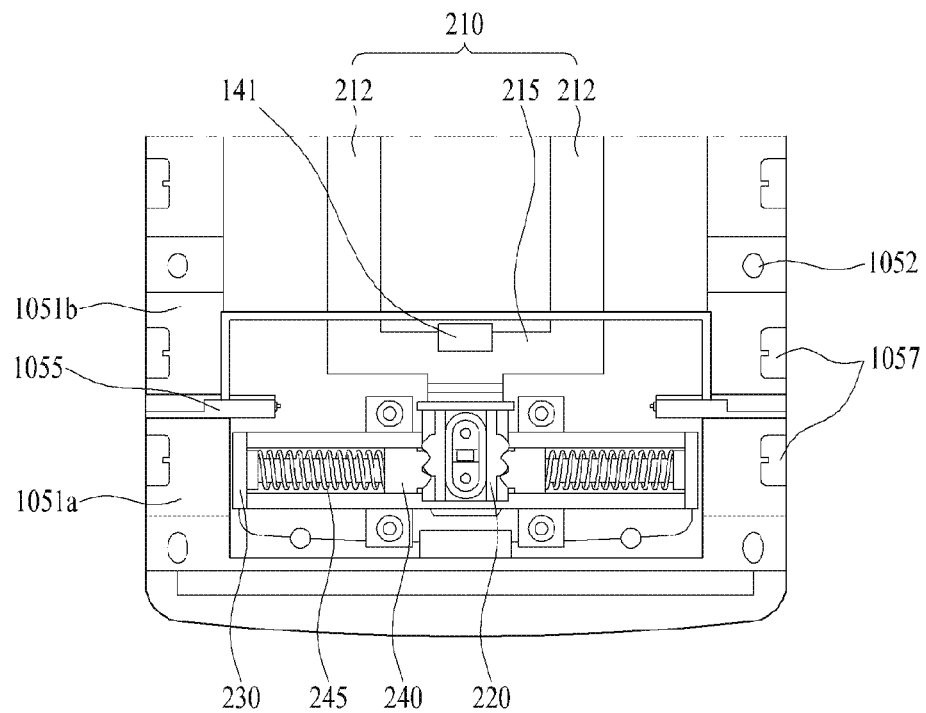

FIGS. 10A and 10B illustrate a change of the variable frame 200 of the mobile terminal according to the present invention. FIG. 10A illustrates the variable frame 200 in a state that the hinge frame 105 is not curved, and FIG. 10B illustrates the variable frame 200 in a state that the hinge frame 105 is curved in a curved shape. The variable frame 200 includes an elastic tape 210 and length control units 230 and 240 as described above, and a position of the elastic tape 210 is varied depending on a shape of the hinge frame 105.

The first end of the elastic tape 210 is fixed to the hinge frame 105 in accordance with a curvature change of the hinge frame 105 but the position in the other portions is varied relatively with respect to the hinge frame 105. The curvature change of the hinge frame 105 may be sensed by sensing of the position change of the elastic tape 210, and the position change of the second end is the greatest.

If the elastic tape 210 is comprised of a pair of tapes 212 extended in a length direction and the ⌐ shaped elastic tape 210 to which the second end is coupled is used in the same manner as this embodiment, a connecting unit 215 through which the pair of tapes 212 are connected with each other is moved along the length direction of the mobile terminal 100 as shown in FIGS. 10A and 10B.

A proximity sensor 141 may be arranged at a position corresponding to the connecting unit 215 to sense a shape change of the mobile terminal 100. The proximity sensor 141 includes a light-emitting unit emitting light and a light-receiving unit in which light emitted from the light-emitting unit is received by reflection, and determines whether an object is approaching on the basis of intensity of light received from the light-receiving unit.

Figure 11:
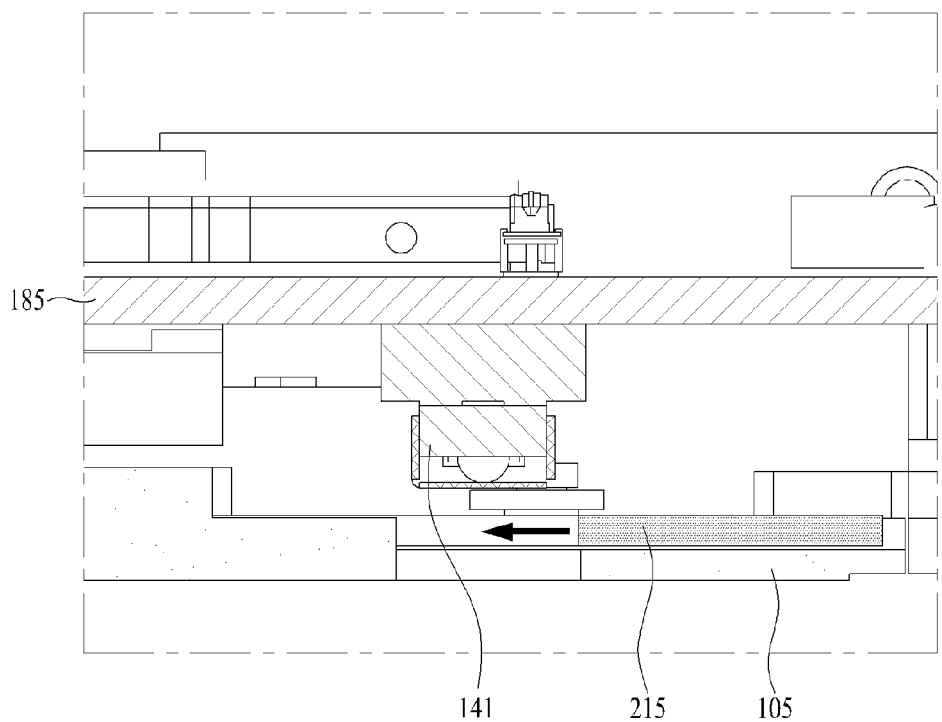
FIG. 11 is a view illustrating an example of a curvature change sensing device of a mobile terminal according to the present invention.

As shown in FIG. 11, the proximity sensor 141 may be packaged in a rear direction of a main board 185, and when the mobile terminal 100 is flat (although the elastic tape 210 in FIG. 10A does not cover the proximity sensor 141, when the mobile terminal 100 is curved (FIG. 10B), the proximity sensor 141 is overlapped with the connecting unit 215, whereby the proximity sensor 141 may generate a signal.

If the position of the proximity sensor 141 is varied, when the mobile terminal 100 is flat, light may be received by the light-receiving unit of the proximity sensor 141 to generate a signal, and when the mobile terminal 100 is curved along a curve, light may not be received by the light-receiving unit of the proximity sensor 141 so as not to generate a signal.

Figure 12:
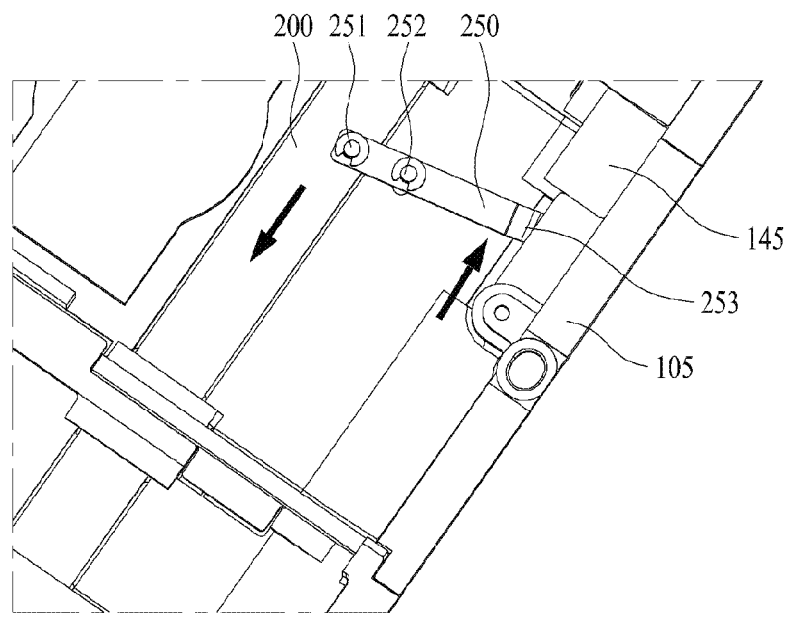
FIGS. 12A and 12B are views illustrating another example of a curvature change sensing device of a mobile terminal according to the present invention.
Figure 12:
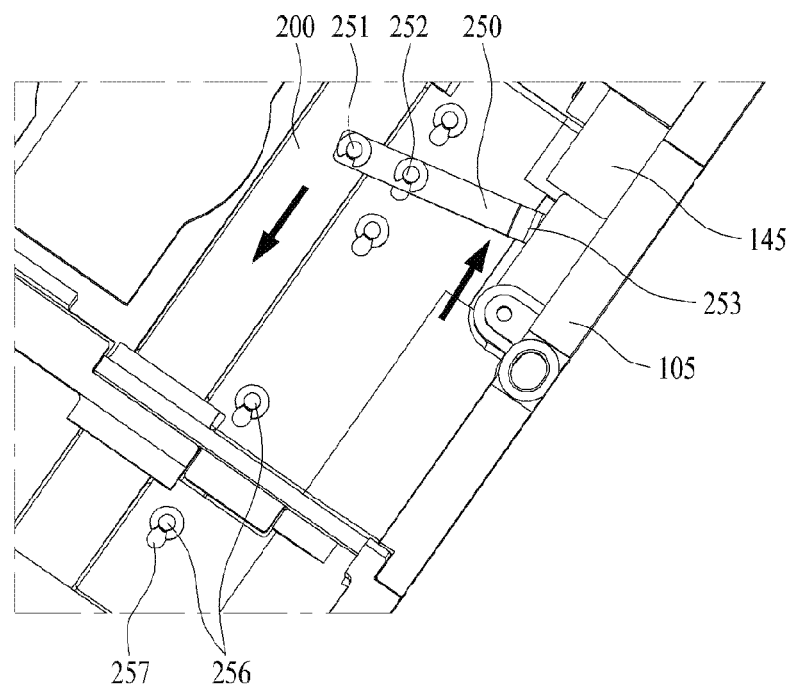
Figure 13A:
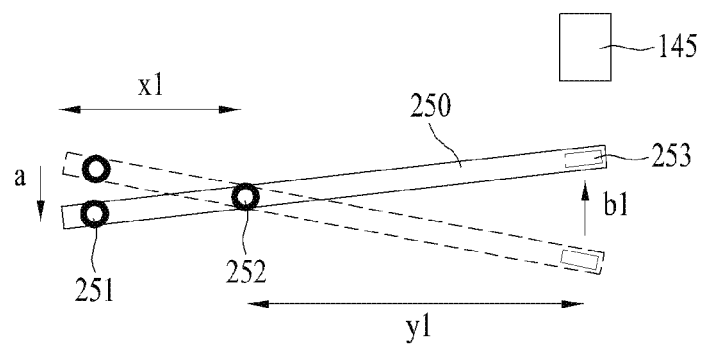
FIGS. 13A and 13B are conceptual views illustrating a driving of a curvature change sensing device of a mobile terminal according to the present invention.
Figure 13B:
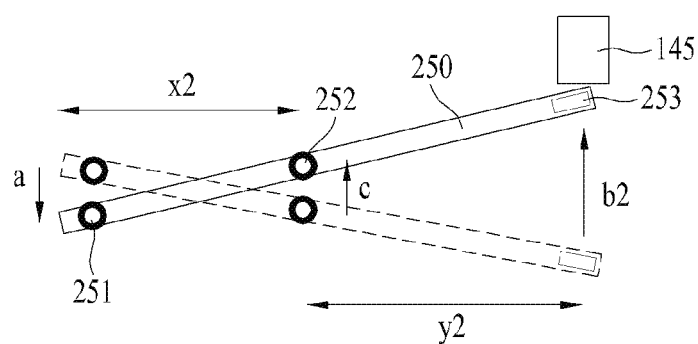

FIGS. 12A and 12B relate to another embodiment of a curvature change sensing device of a mobile terminal 100 according to the present invention, and FIGS. 13A and 13B are conceptual views illustrating a driving of a curvature change sensing device of a mobile terminal 100 according to the present invention. In this embodiment, quantity of motion of the elastic tape 210 is measured to sense a folded level.

However, if quantity of motion of the elastic tape 210 is measured directly, quantity of motion is minor, whereby there is difficulty in exact measurement. For more exact measurement, a rotation rod 250 for amplifying quantity of motion of the elastic tape 210 may further be provided. The rotation rod 250 is fixed to the elastic tape 210 and the hinge frame 105 by a first pin 251 and a second pin 252.

Referring to FIG. 12A, the first pin 251 fastens a first end of the rotation rod 250 to the elastic tape 210 rotatably based on the first pin 251, and the second pin 252 is spaced apart from the first pine 251 at a first distance x1 to fasten the rotation rod 250 to the hinge frame 105 rotatably. If the elastic tape 210 is moved, the second end of the rotation rod 250 is moved based on the second pin 252.

Referring to FIG. 13A, when the distance between the second end of the rotation rod 250 and the second pin 252 is a second distance y1, if the second distance y1 is longer than the first distance x1, the second end of the rotation rod 250 moves at a distance b1 greater than the moved distance 'a' of the elastic tape 210.

A hole sensor 145 may sense a position change of the rotation rod 250 if the distance between the second end of the rotation rod 250 and a magnet 253 is varied, and the controller 180 may recognize a curvature change of the mobile terminal 100 on the basis of a signal of the hole sensor 145. The hole sensor 145 may recognize a gradual curvature change by subdividing magnetic intensity sensed by the hole sensor 145. The controller 180 may change the configuration of the mobile terminal 100 in accordance with the curvature change.

Figure 14:
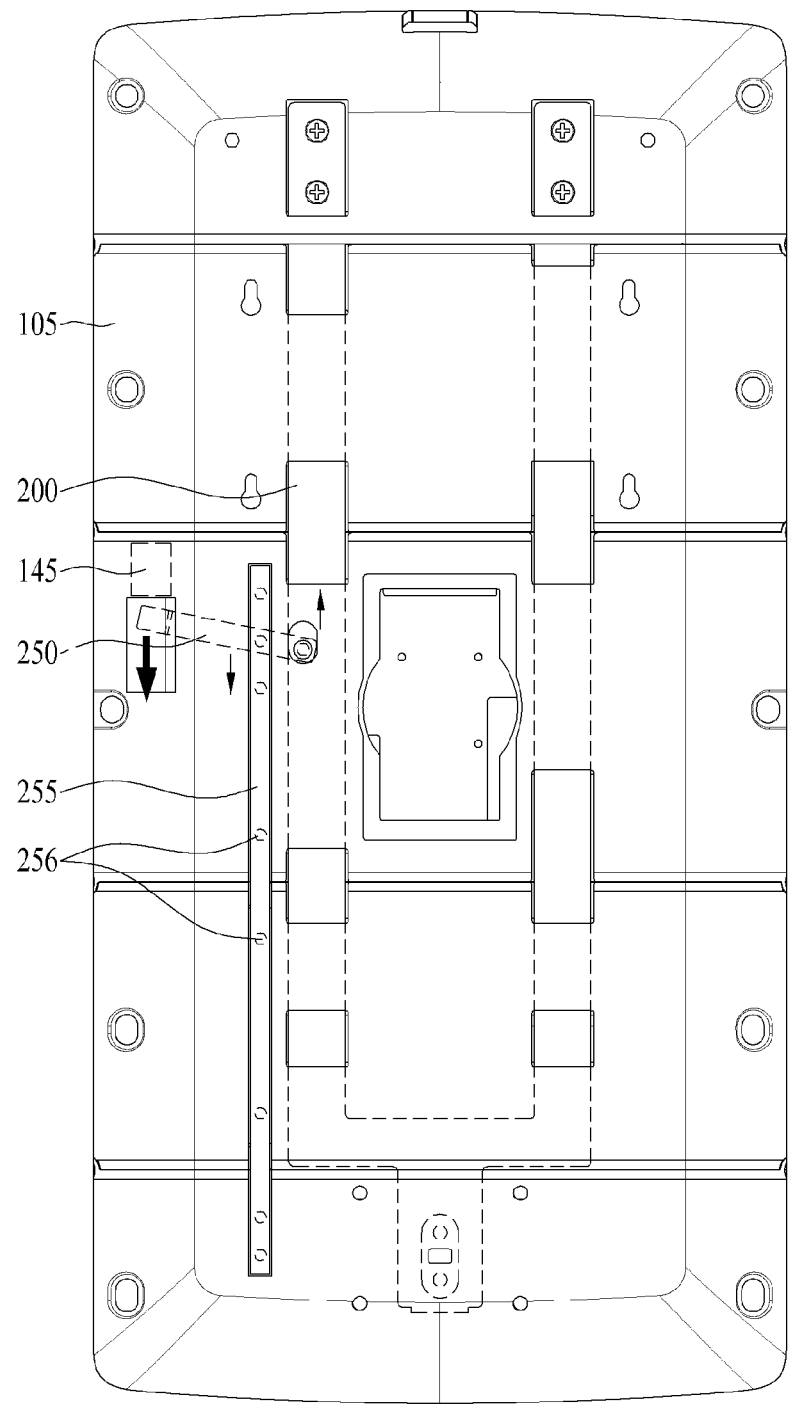
FIG. 14 is a rear view illustrating an example of a mobile terminal according to the present invention.

FIG. 12B illustrates a modified embodiment of FIG. 12A, and in FIG. 12B, a side tape 255 coupled to the second pin is further provided. FIG. 14 illustrates a rear surface of the mobile terminal 100 according to the present invention, and in FIG. 14, the side tape 255 may be located on a front surface of the hinge frame, or may be arranged on a rear surface of the hinge frame.

A first end of the side tape 255 is coupled to the other side of the hinge frame 105 (the elastic tape 210 is coupled to one side of the hinge frame 105) and extended along one side direction of the hinge frame 105 in parallel with the elastic tape 210.

If the hinge frame 105 is folded to form a curved surface, the elastic tape 210 and the side tape 255 are moved in an opposite direction with respect to the hinge frame 105. Referring to FIG. 13A, the position of the second pin 252 is varied unlike the embodiment of FIG. 12. If the moved distance 'a' of the elastic tape 210 is substantially the same as the moved distance 'c' of the side tape 255, the center of the first pin 251 and the second pin 252 becomes a rotational shaft of the rotation rod 250, whereby the second end of the rotation rod 250 is moved as much as b2.

If the first lengths x1 and x2 are the same as the second lengths y1 and y2 in these embodiments, b2 may be greater than b1 in the moved distance of the second end of the rotation rod.

Since the side tape 255 may be spaced apart from the hinge frame 105 if the mobile terminal 100 is curved, the side tape 255 may be needed to be fixed to the hinge frame 105 to avoid the spacing. However, if the side tape 255 is fixed to the hinge frame, a problem occurs in that an angle change of the hinge frame 105 is restricted.

Therefore, a hollow hole 257 is formed at the hinge frame 105, and the side tape 255 may be fixed using a third pin 256 which is moved along the hollow hole 257. The hollow hole 257 is extended in a length direction of the hinge frame 105, and may be formed at a length corresponding to the position change of the side tape 255 when the angle of the hinge frame 105 is varied.

As described above, the mobile terminal 100 according to the present invention may control its curved level in accordance with the use condition. Therefore, it is advantageous in that a sense of immersion of the screen is increased by the control of the curvature of the mobile terminal if necessary and it is convenient to set the mobile terminal.

Also, the problem between the respective members may be solved during curve deformation, whereby a natural curve may be provided.

It will be apparent to those skilled in the art that the present invention can be embodied in other specific forms without departing from the spirit and essential characteristics of the invention. Thus, the above embodiments are to be considered in all respects as illustrative and not restrictive. The scope of the invention should be determined by reasonable interpretation of the appended claims and all change which comes within the equivalent scope of the specification are included in the scope of the invention.

What is claimed is:

1. A mobile terminal comprising:
    a display module including a flexible display;
    a hinge frame coupled to a rear side of the display module, the hinge frame having a plurality of unit frames, at least one hinge connecting each of the plurality of unit frames to an adjacent unit frame, wherein the plurality of unit frames include a first unit frame located at one end of the hinge frame and a second unit frame located at the other end of the hinge frame; and
    a variable frame including a first portion attached to the first unit frame and a second portion attached to the second unit frame, the variable frame having a variable length,
    wherein the display module and the hinge frame are positionable between a bent configuration and a flat configuration based on the variable length of the variable frame that is increased or decreased,
    wherein the variable frame comprises:
        a length control unit fixed at the second unit frame; and
        an elastic tape including a first end fixed to the first unit frame and a second end coupled to the length control unit; and
    wherein a coupling position of the elastic tape, to which the length control unit is coupled, is variable.

2. The mobile terminal according to claim 1, wherein:
    the elastic tape includes a plurality of hanging protrusions formed at the second end; and
    the length control unit includes fixed protrusions fixed to the hinge frame to adjoin between the plurality of hanging protrusions and an elastic member applying a force to the fixed protrusions in a direction of the plurality of hanging protrusions.

3. The mobile terminal according to claim 1, wherein the elastic tape is located in a front surface of the hinge frame, and the at least one hinge is located in a rear surface of the hinge frame.

4. The mobile terminal according to claim 1, wherein the length control unit includes:
    a driver configured to control its position fastened to the elastic tape; and
    a controller configured to control the driver to increase a length of the variable frame or to arrange the display module in a horizontal direction in response to a curve command.

5. The mobile terminal according to claim 1, wherein:
    the first unit frame has an extension part protruded in a direction of a unit frame adjacent at a boundary of the unit frame; and
    the second unit frame is coupled to the first unit frame by the at least one hinge and has a recessed part cut to correspond to the extension part.

6. The mobile terminal according to claim 5, wherein:
    the extension part includes an incline formed on a rear surface of the extension part.

7. The mobile terminal according to claim 5, wherein the extension part includes an aperture formed at a portion through which the variable frame passes.

8. The mobile terminal according to claim 1, wherein the hinge frame includes:
    a boss protruded from a rear surface of the display;
    a boss hole formed in the hinge frame through which the boss passes; and
    a screw inserted to the boss through a rear surface of the hinge frame,
    wherein the boss hole at a center portion in a length direction of the hinge frame has a size corresponding to a shape of the boss, and boss holes located at an upper portion and a lower portion of the hinge frame in the length direction are greater in their size than a size of the boss in a length direction.

9. The mobile terminal according to claim 8, further comprising a subsidiary plate coupled on the rear surface of the display, wherein the boss is formed on the subsidiary plate, and coupling portion between the display and the subsidiary plate has an area that is narrower than a diameter of the boss in a length direction.

10. The mobile terminal according to claim 1, further comprising a rear case covering a rear surface of the hinge frame, wherein the rear case is coupled to the display and the hinge frame, and the rear case includes an elastic material.

11. The mobile terminal according to claim 10, wherein the rear case comprises:
    a sidewall covering sides of the display and the hinge frame;
    a coupling clip protruded inwardly from the sidewall, having a narrow inlet between the display and the hinge frame and a wide inner side; and
    a coupling protrusion protruded on the rear side of the display at a position corresponding to the coupling clip.

12. The mobile terminal according to claim 11, further comprising a recess part formed in the hinge frame at a position corresponding to the coupling protrusion and the coupling clip, wherein the recess part is formed along a circumference of the hinge frame, and the recess unit has an outer sidewall that is opened.

13. The mobile terminal according to claim 12, wherein:
    the coupling clip has a ring shape that includes an inlet opened toward an inner side of the rear case;
    the coupling protrusion has a cylindrical shape with a size corresponding to a size of the ring shape; and
    the recess unit further includes a support protrusion inserted to the opened inlet of the coupling clip at the sidewall of the recess unit.

14. The mobile terminal according to claim 10, further comprising:
    a fitting protrusion protruded in a front direction from an inner side of the rear case; and
    a fitting hole formed at a position corresponding to the fitting protrusion of the hinge frame.

15. The mobile terminal according to claim 1, further comprising a curvature sensing device configured to sense a curvature radius of the variable frame, wherein the curvature sensing device comprises:

an optical sensor having a light-emitting unit and a light-receiving unit, the optical sensor selectively covered by the elastic tape according to a length change of the variable frame; and a controller configured to calculate a curvature of the hinge frame based on whether light emitted from the light-emitting unit is reflected in the elastic tape and received in the light-receiving unit.

16. The mobile terminal according to claim 15, wherein the curvature sensing device further comprises:

a rotation rod having a first end coupled to the elastic tape rotatably by a first pin, the first end rotatably coupled to the hinge frame by a second pin at a position that is spaced apart from the first pin by a first distance; and an operation sensor configured to sense a motion of a second end of the rotation rod.

17. The mobile terminal according to claim 16, wherein:

the curvature sensing device further comprises a magnetic material located at the second end of the rotation rod;

the operation sensor is a hole sensor configured to sense a magnetic change based on a position of the magnetic material; and the controller is further configured to calculate the curvature of the hinge frame and the length change of the variable frame based on magnetic intensity sensed by the hole sensor.

18. The mobile terminal according to claim 17, wherein a second distance from the second pin to the second end of the rotation rod is longer than the first distance.

19. The mobile terminal according to claim 15, wherein the curvature sensing device further comprises:

a side tape having a first end coupled to the other side of the hinge frame, extended in a direction of one side of the hinge frame;

a rotation rod having a first end rotatably coupled to the elastic tape by a first pin, rotatably coupled to the side tape by a second pin at a position that is spaced apart from the first pin by a first distance; and an operation sensor configured to sense a motion of a second end of the rotation rod.

20. The mobile terminal according to claim 19, wherein the curvature sensing device further comprises:

a hollow hole formed in the hinge frame and corresponding to the side tape; and a third pin fastened to the side tape and inserted into the hollow hole, wherein a position of the third pin varies within the hollow hole according to the length change of the variable frame.

\* \* \* \* \*